United States Patent
Tam

(10) Patent No.: US 10,458,826 B2
(45) Date of Patent: Oct. 29, 2019

(54) MASS FLOW SENSOR MODULE AND METHOD OF MANUFACTURE

(71) Applicant: Ubotic Company Limited, Hong Kong (CN)

(72) Inventor: Ming-Wa Tam, Hong Kong (CN)

(73) Assignee: UBOTIC COMPANY LIMITED, Hong Kong (CN)

( * ) Notice: Subject to any disclaimer, the term of this patent is extended or adjusted under 35 U.S.C. 154(b) by 204 days.

(21) Appl. No.: 15/686,394

(22) Filed: Aug. 25, 2017

(65) Prior Publication Data

US 2019/0063971 A1    Feb. 28, 2019

(51) Int. Cl.
| | | |
|---|---|---|
| G01F 1/684 | (2006.01) | |
| B81B 7/00 | (2006.01) | |
| H01L 23/00 | (2006.01) | |
| G01F 15/00 | (2006.01) | |
| G01F 1/688 | (2006.01) | |

(52) U.S. Cl.
CPC ............ G01F 1/684 (2013.01); B81B 7/0032 (2013.01); G01F 1/6845 (2013.01); G01F 15/00 (2013.01); H01L 24/91 (2013.01); H01L 24/97 (2013.01); H01L 24/98 (2013.01); *G01F 1/6888* (2013.01)

(58) Field of Classification Search
CPC ........ G01F 1/684; G01F 15/00; G01F 1/6845; G01F 1/6888; B81B 7/0032; H01L 24/80; H01L 24/90; H01L 24/97; H01L 24/98
See application file for complete search history.

(56) References Cited

U.S. PATENT DOCUMENTS

| | | | | |
|---|---|---|---|---|
| 7,704,774 B2* | 4/2010 | Mayer | .................. | B81C 1/0023 257/E21.001 |
| 8,659,167 B1* | 2/2014 | Bowles | ................. | B81C 1/0023 257/777 |
| 8,809,974 B2* | 8/2014 | Lo | ......................... | B81B 7/0061 257/416 |
| 9,601,413 B2* | 3/2017 | Fan | ..................... | H01L 23/49551 |
| 9,659,855 B2* | 5/2017 | Fan | ..................... | H01L 23/4952 |
| 9,865,528 B2* | 1/2018 | Ping | ................... | H01L 23/49568 |
| 9,991,194 B1* | 6/2018 | Tam | ........................ | H01L 24/97 |
| 2004/0188648 A1* | 9/2004 | Xie | ..................... | F16K 99/0001 251/11 |
| 2009/0045441 A1* | 2/2009 | Kweon | ............. | H01L 27/14618 257/291 |
| 2010/0193923 A1* | 8/2010 | Tanaka | .................... | B81B 7/007 257/676 |
| 2014/0048946 A1* | 2/2014 | Bowles | ............... | H01L 23/3121 257/774 |

(Continued)

*Primary Examiner* — Savitri Mulpuri
(74) *Attorney, Agent, or Firm* — Keating and Bennett, LLP

(57) ABSTRACT

A mass flow sensor module and method of manufacture thereof are provided, wherein a semiconductor sensor die is integrated within an enhanced molded housing structure that maintains an air tight seal and protects the die from abrasive wear, and which also provides laminar flow of the liquid gas to be sensed. Since the die is embedded in the substrate; there is no need for a spacer for reducing die thickness induced flow turbulence. Moreover, the die surface is at the same level as the top surface of the substrate, such that there is no performance impact due to die thickness variation and therefore no die attach bond line thickness control requirement. In one embodiment, a thermal enhancement capability is provided.

6 Claims, 14 Drawing Sheets

(56) References Cited

U.S. PATENT DOCUMENTS

| | | | |
|---|---|---|---|
| 2014/0374855 A1* | 12/2014 | Lo | B81B 7/0058 257/417 |
| 2015/0200180 A1* | 7/2015 | Fam | H01L 24/83 257/415 |
| 2017/0362077 A1* | 12/2017 | Bai | B81B 7/0058 |
| 2018/0063409 A1* | 3/2018 | Rivard | H04N 5/2258 |
| 2018/0150676 A1* | 5/2018 | Li | G06K 9/00053 |
| 2018/0158743 A1* | 6/2018 | Watanabe | H01L 23/10 |
| 2018/0294302 A1* | 10/2018 | Wang | H01L 27/146 |

* cited by examiner

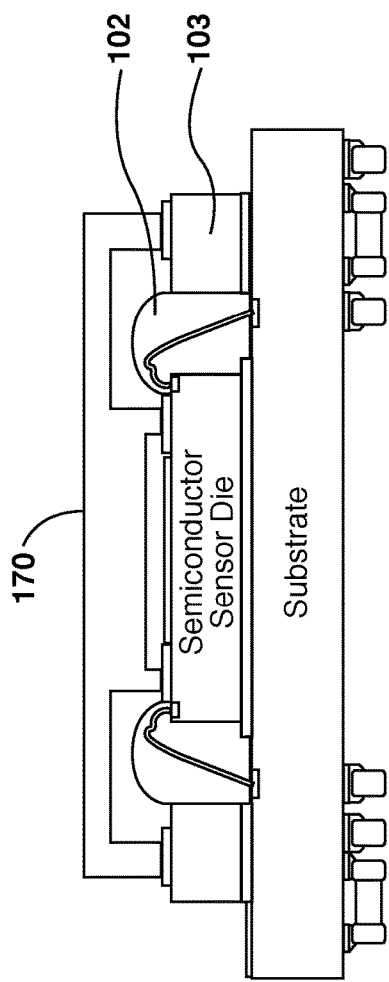
FIG. 1B
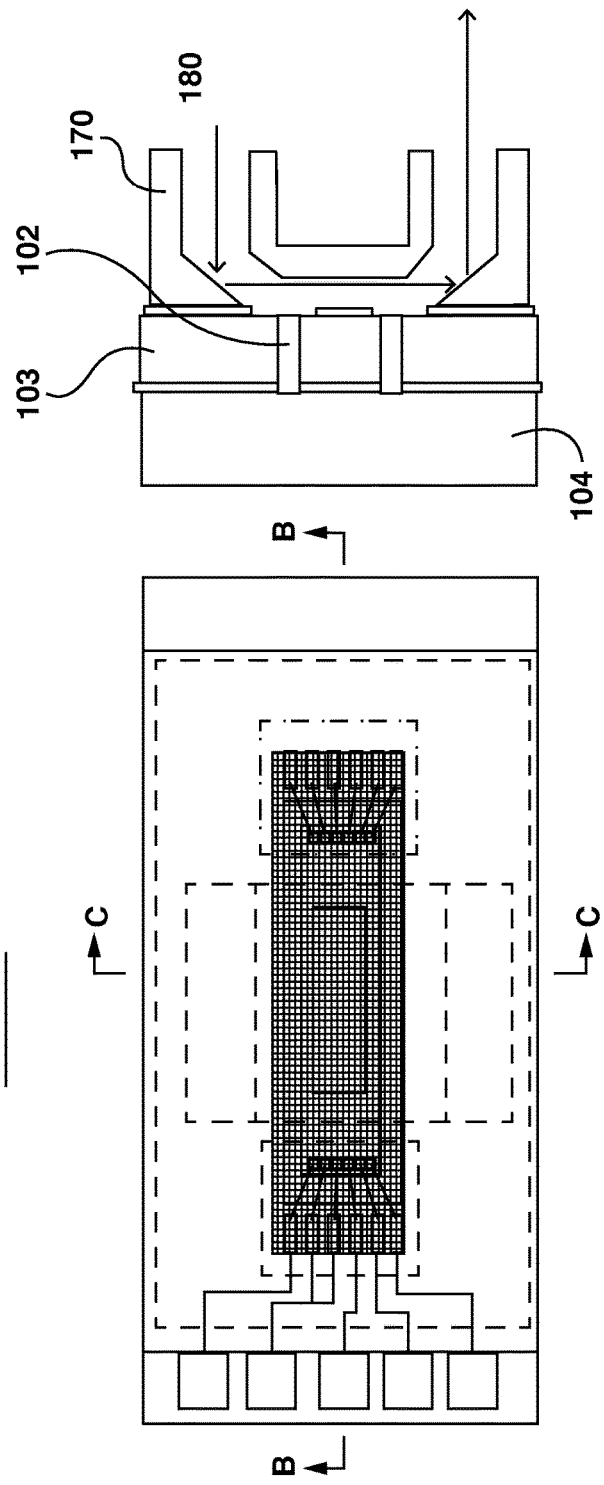
FIG. 1C
FIG. 1A (Prior Art)

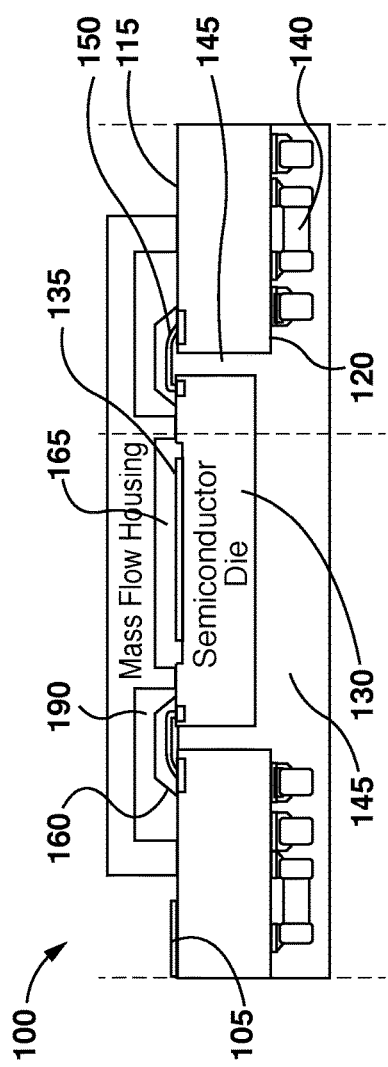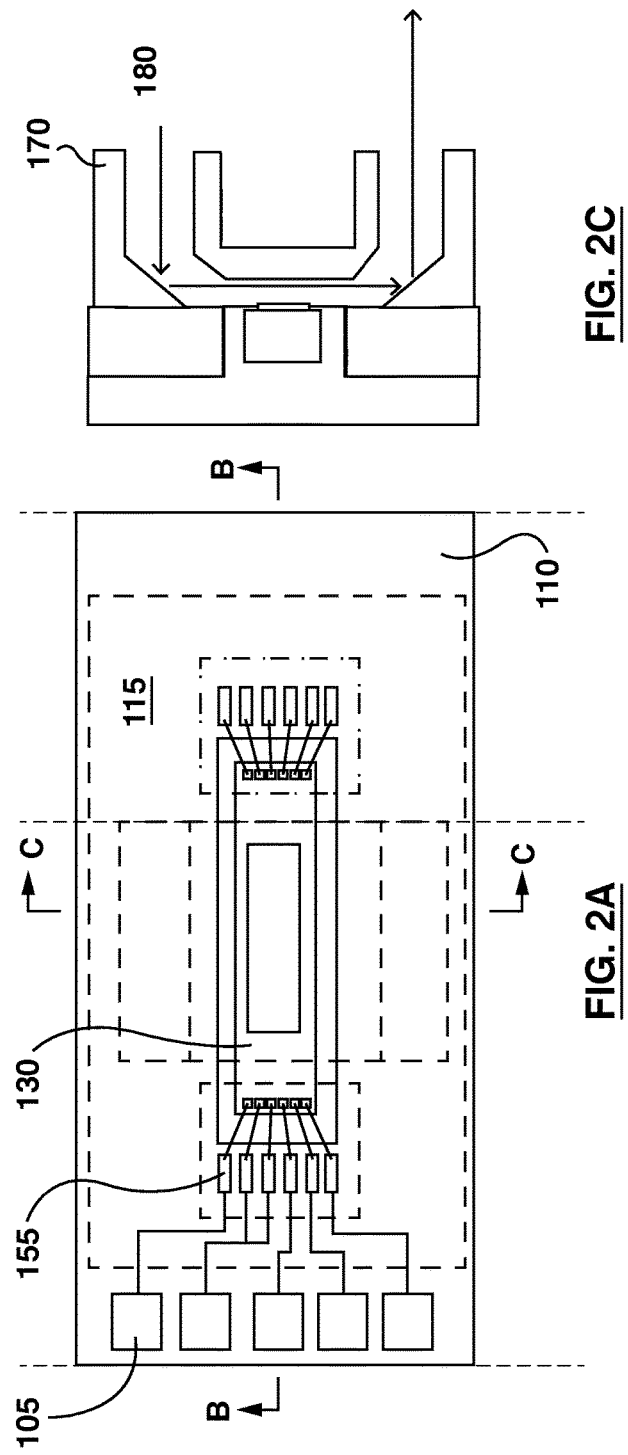
FIG. 2A
FIG. 2B
FIG. 2C

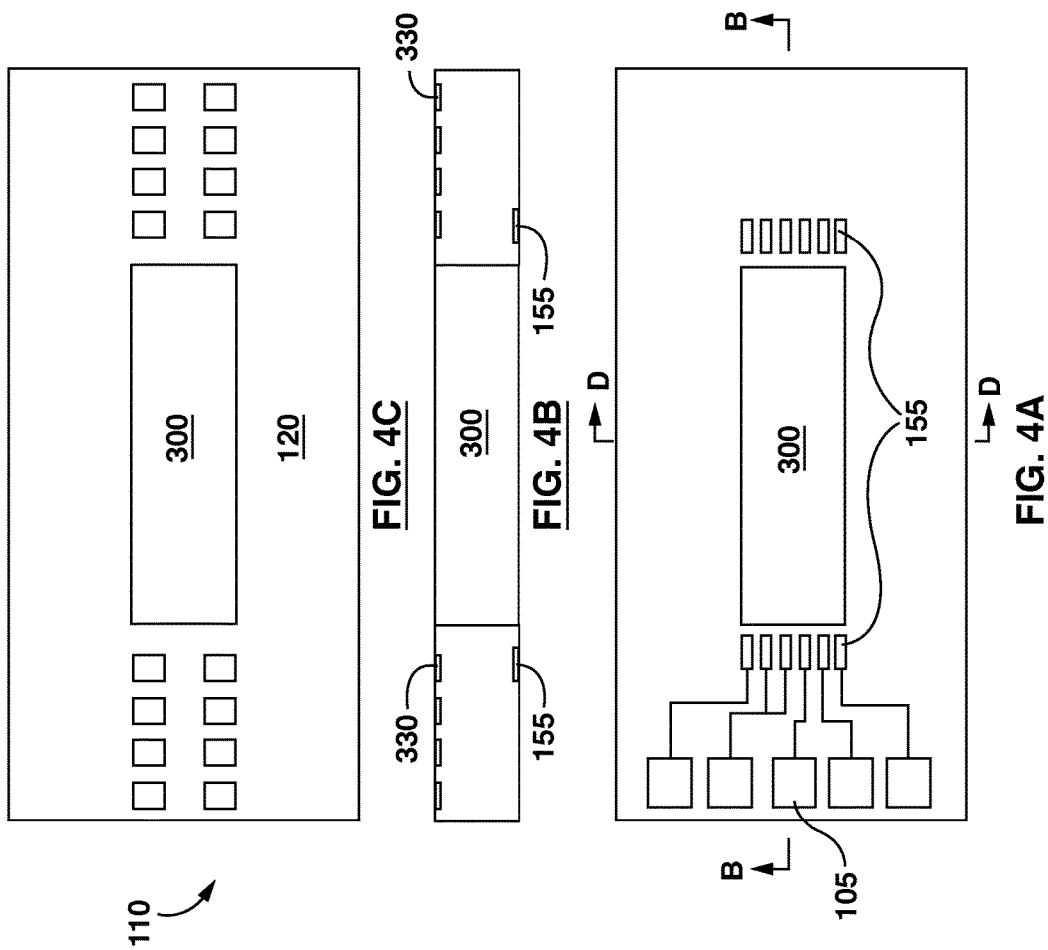

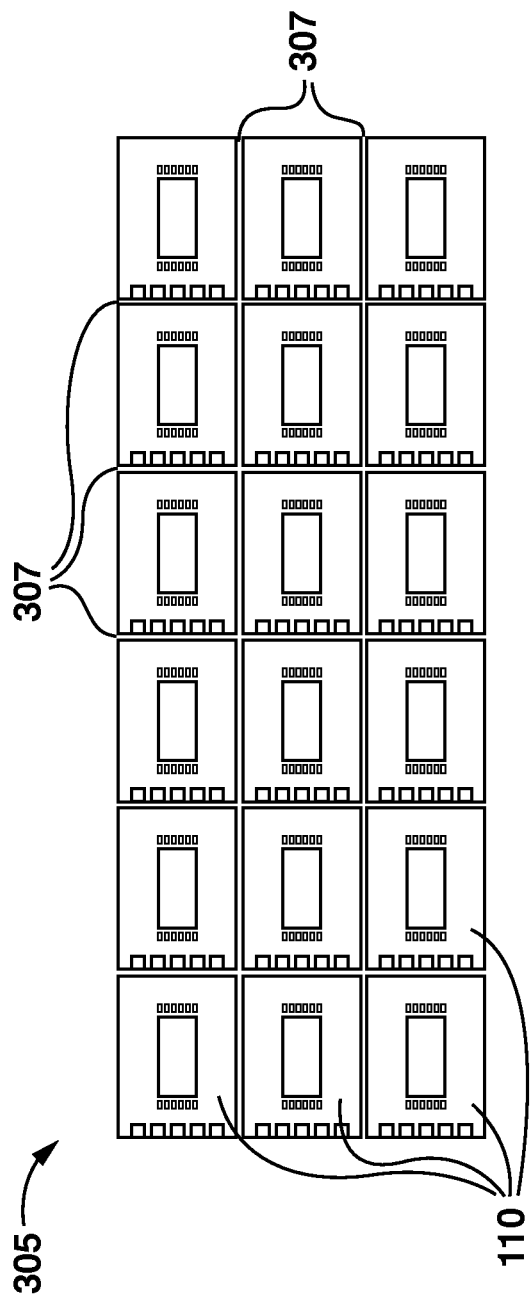

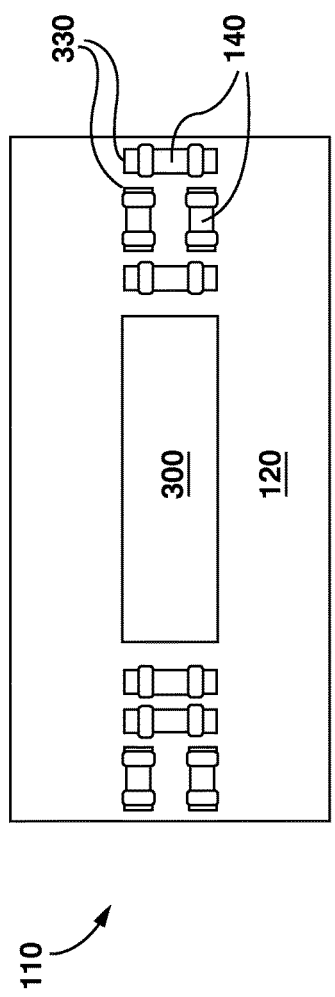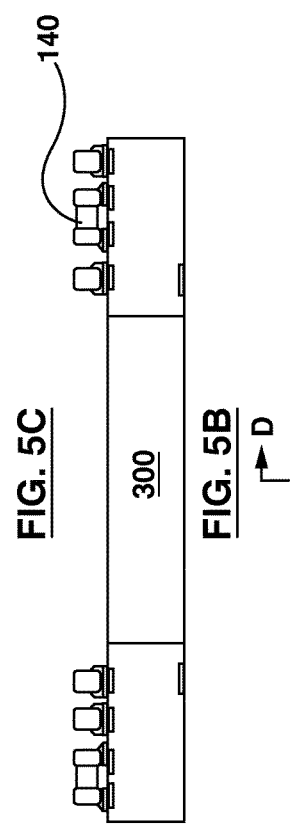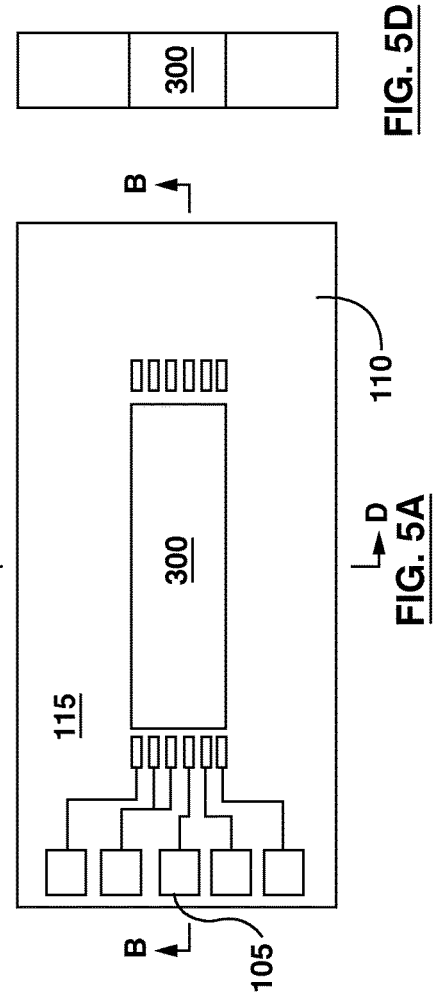

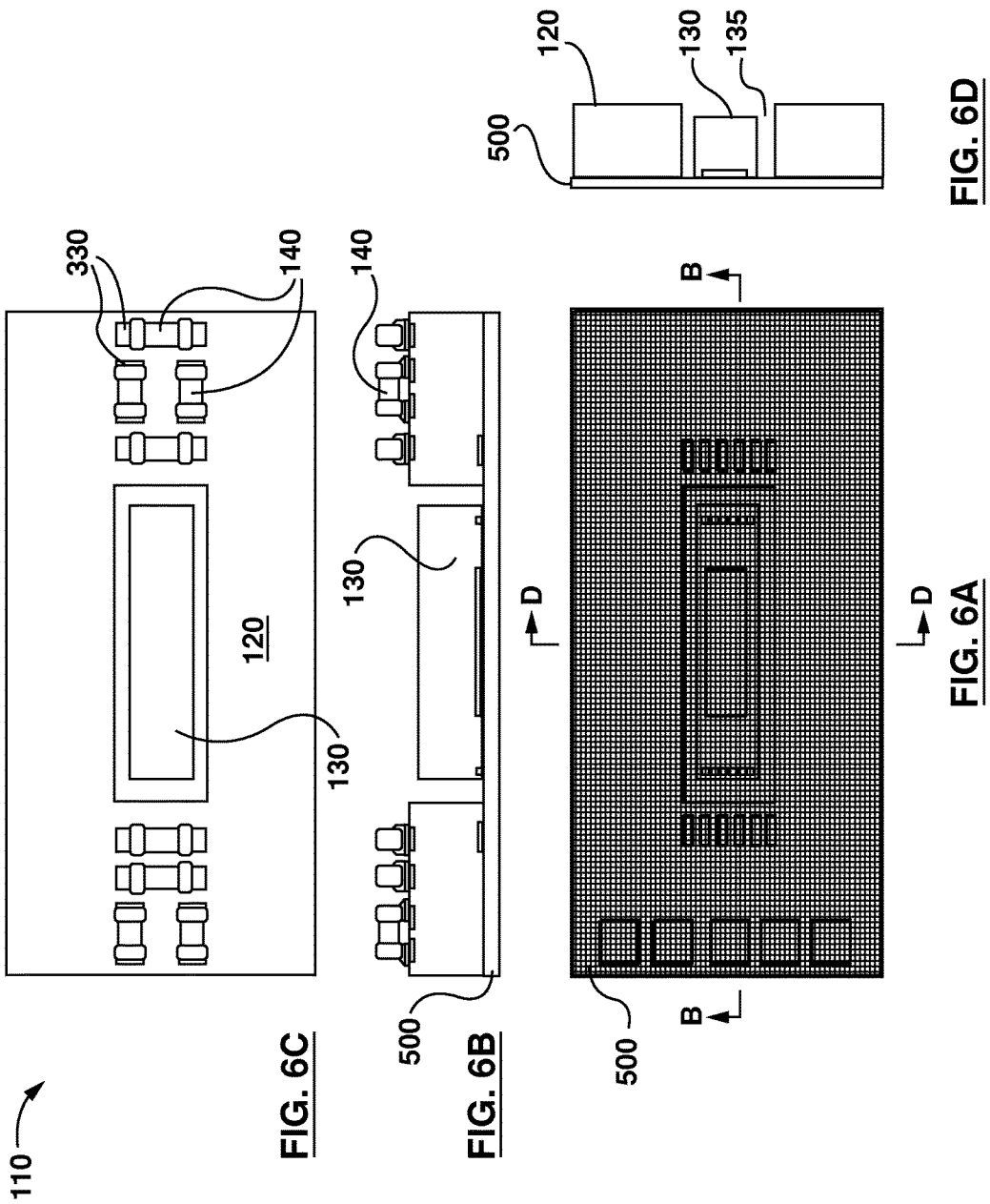

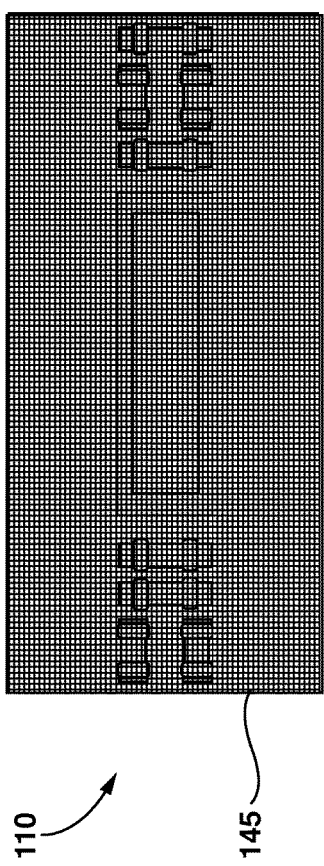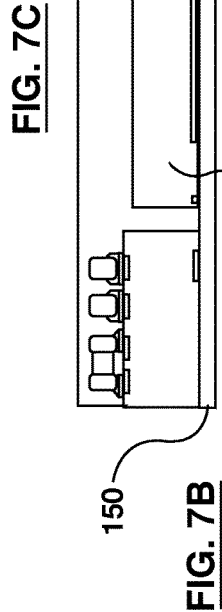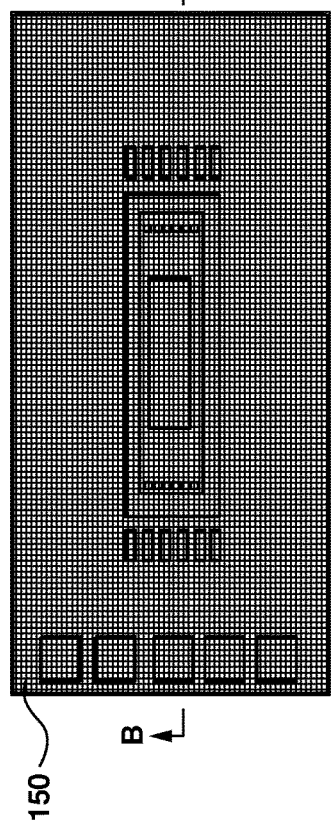
FIG. 7C
FIG. 7B
FIG. 7A
FIG. 7D

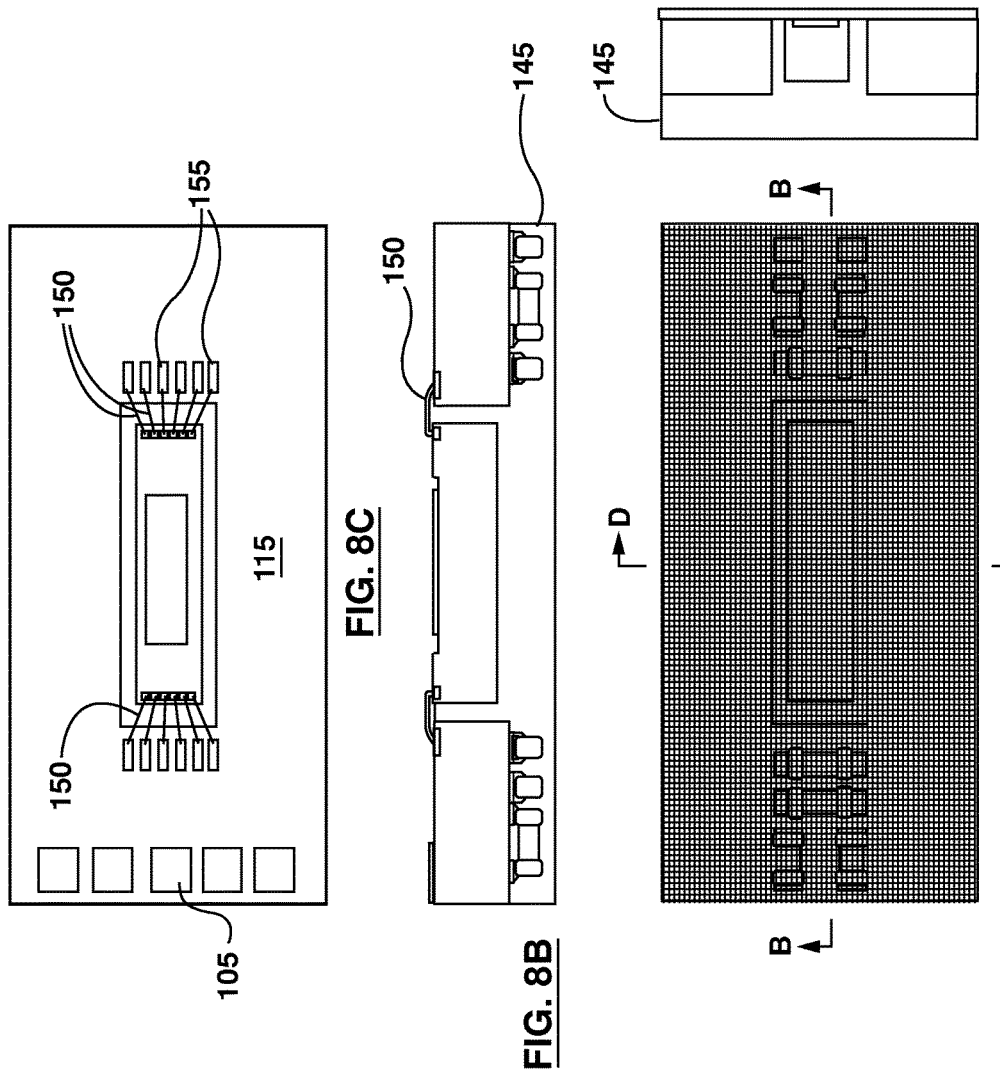

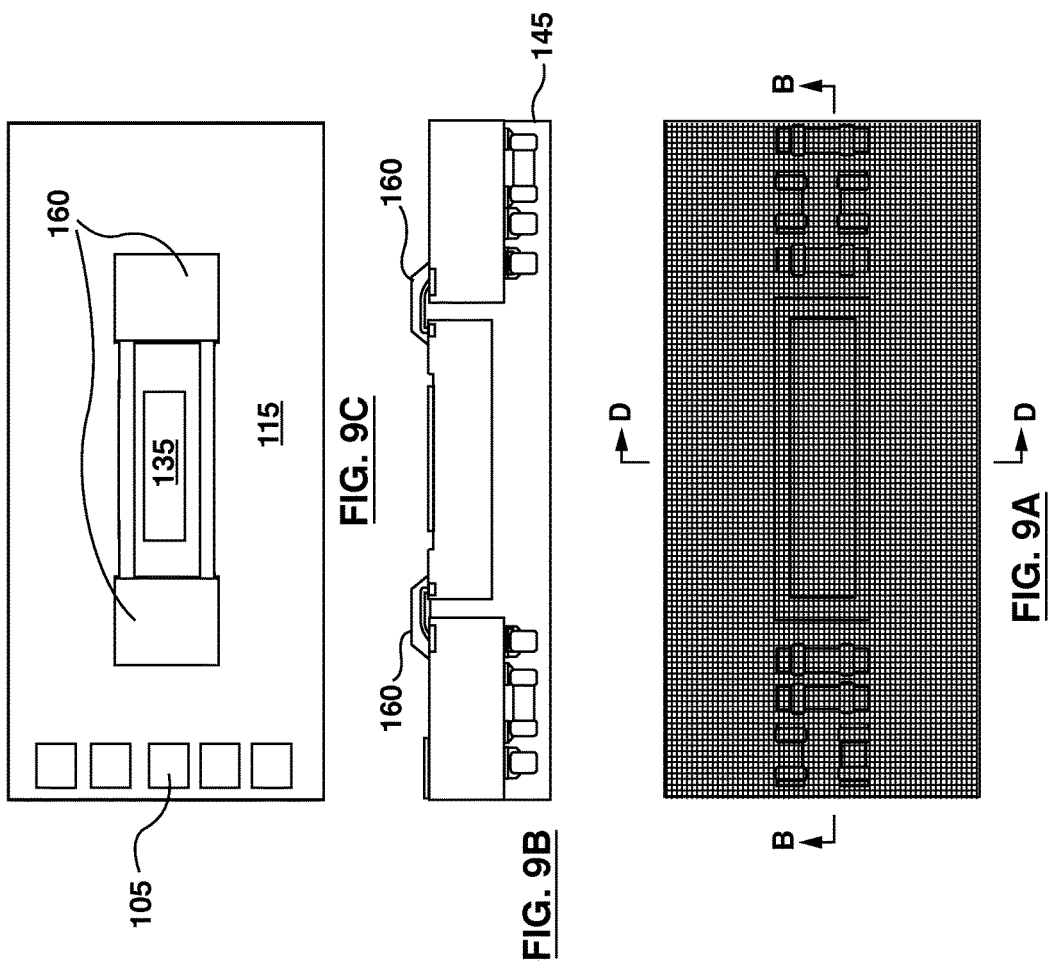

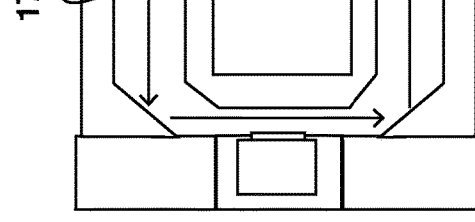
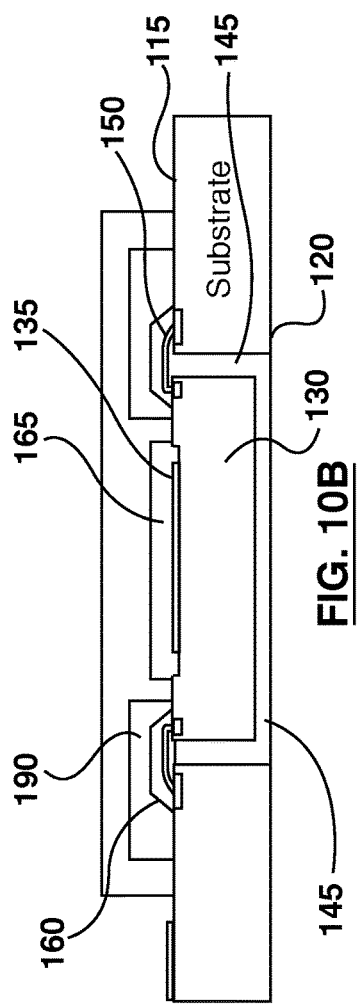
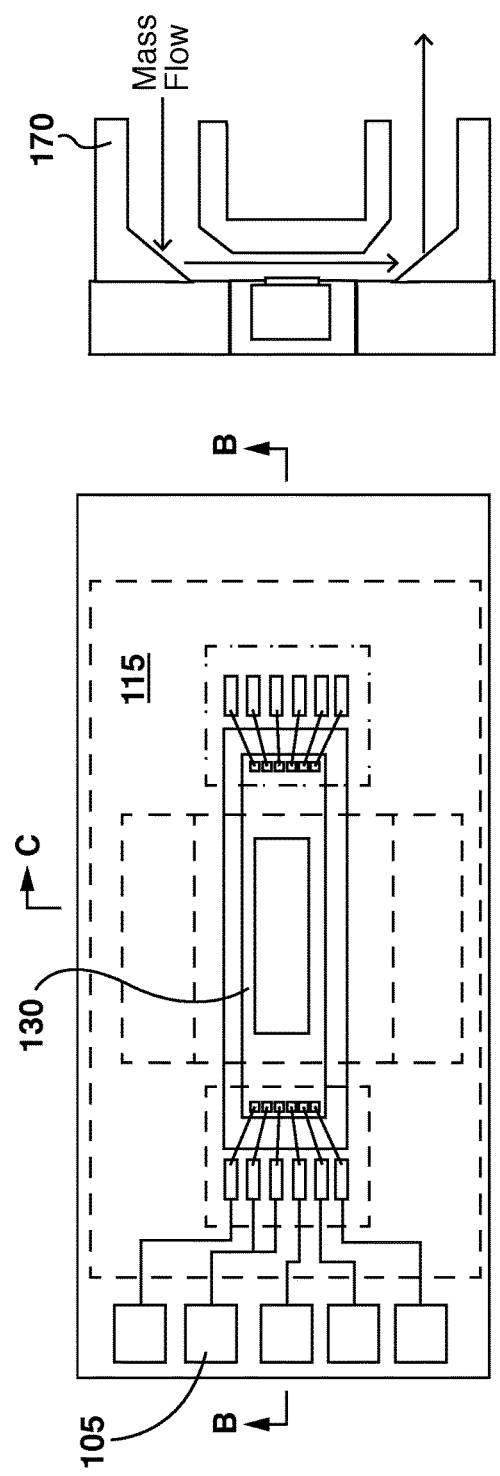
FIG. 10A
FIG. 10B
FIG. 10C

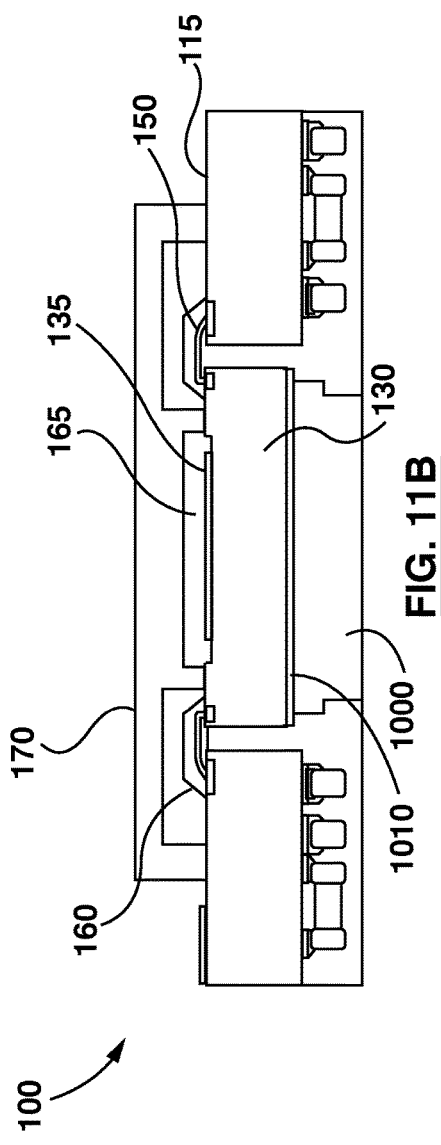
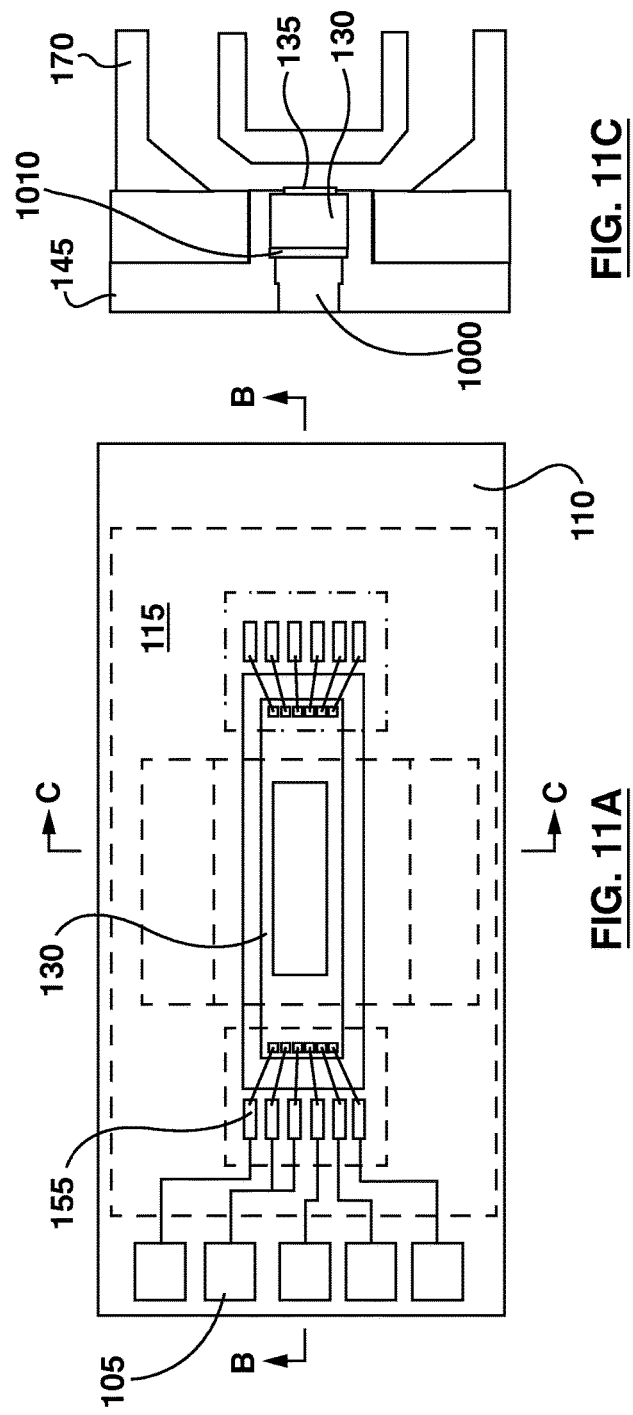
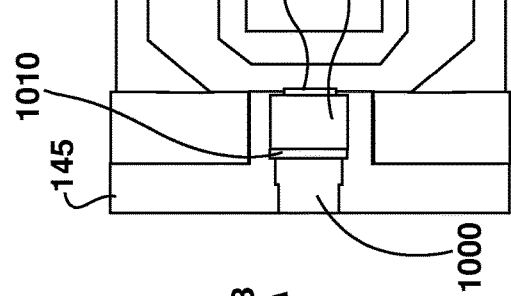
FIG. 11C
FIG. 11B
FIG. 11A

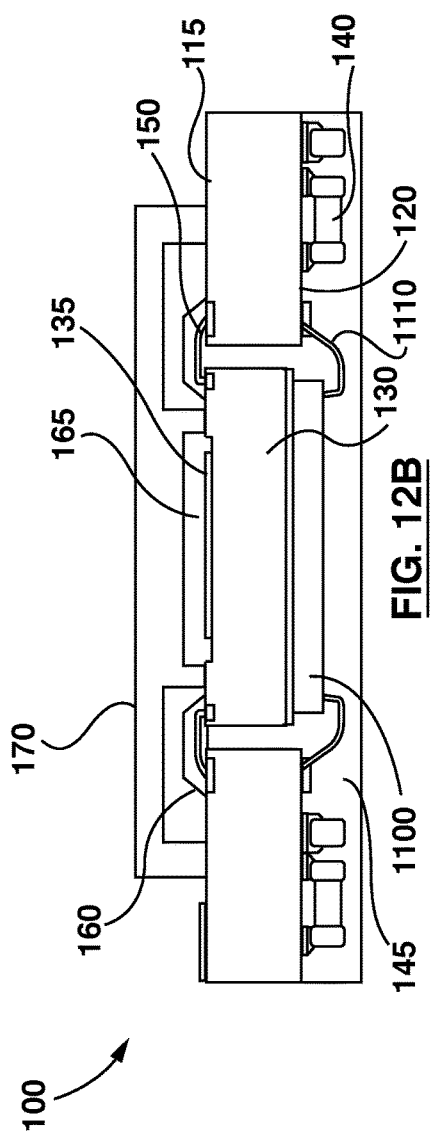
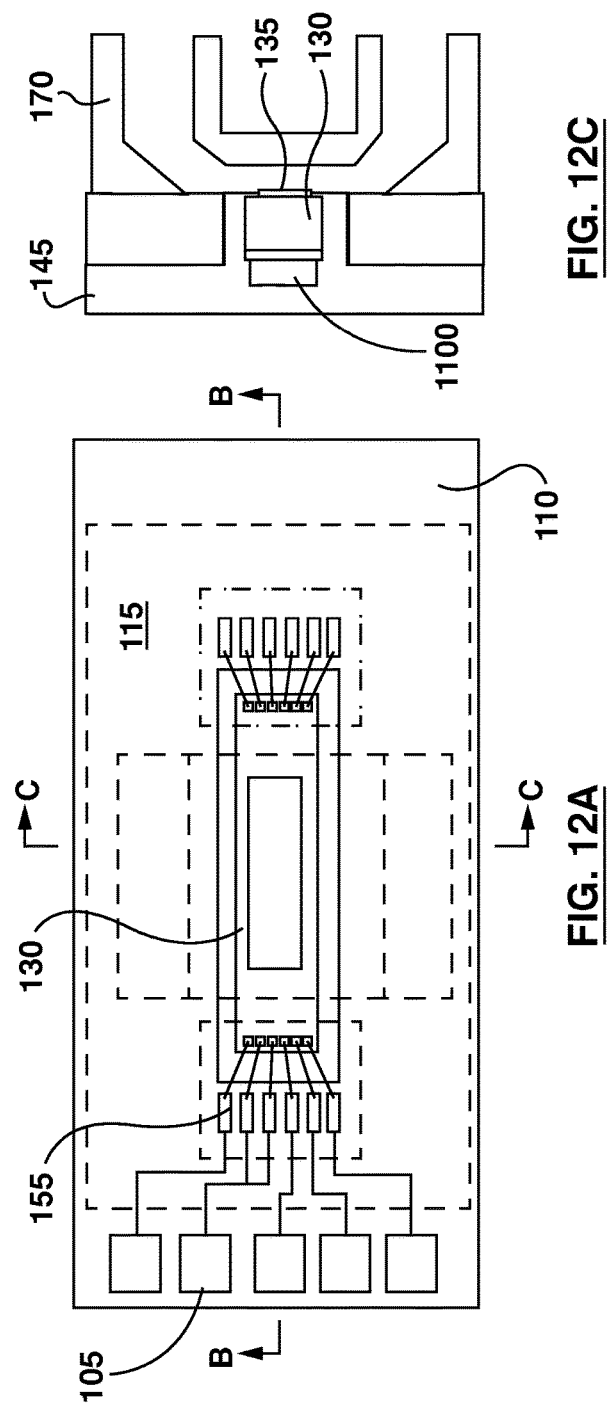
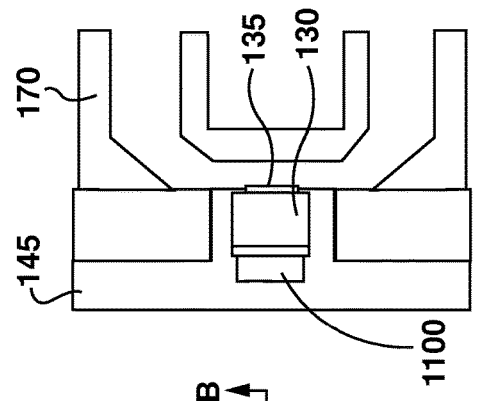
FIG. 12C
FIG. 12B
FIG. 12A

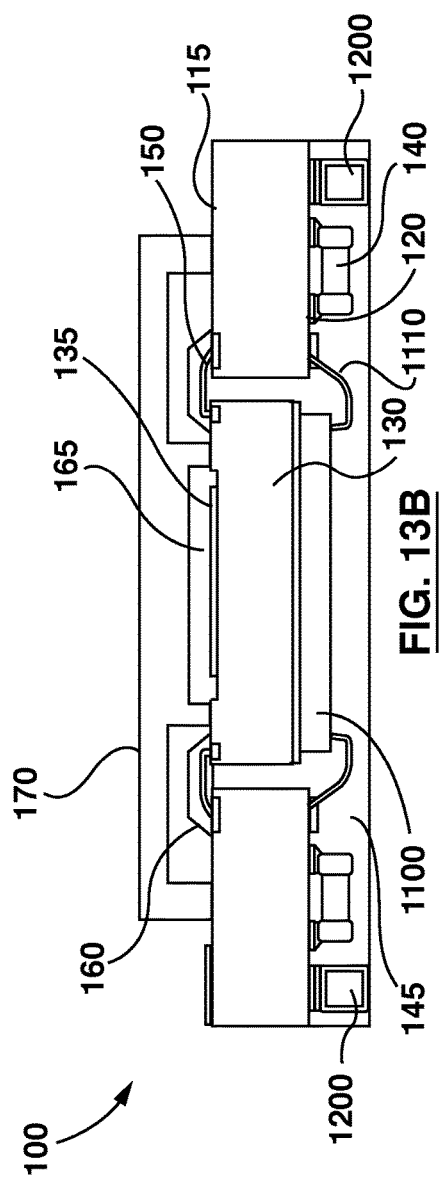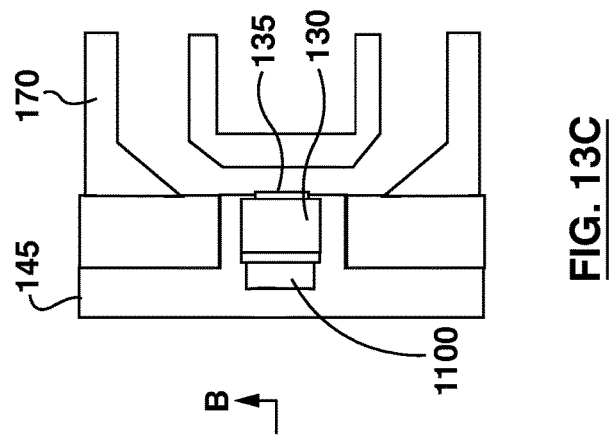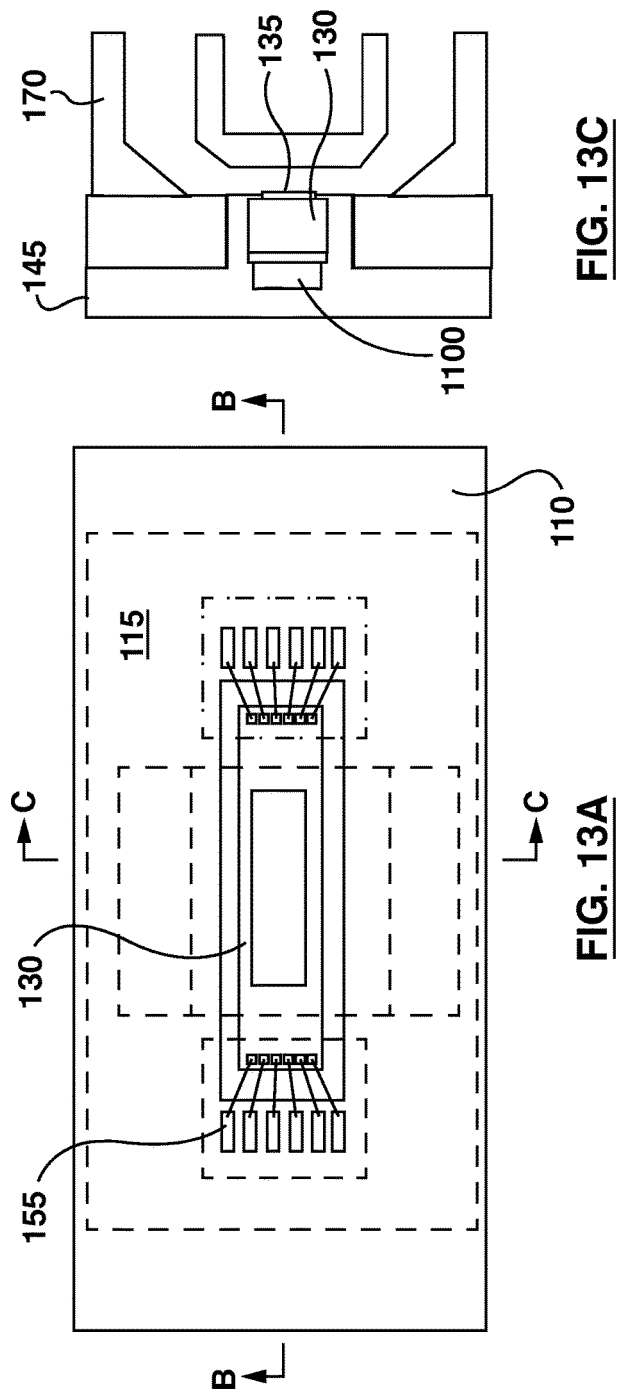

MASS FLOW SENSOR MODULE AND METHOD OF MANUFACTURE

FIELD

The present invention relates generally to semiconductor packages, and more particularly to a mass flow sensor module and a method of manufacture.

BACKGROUND

Mass flow sensing semiconductor devices are known for measuring the flow of gas or liquid across a sensing surface using the thermo-transfer (calorimetric) principle. Such devices can be used for direct measurement in the flow range of 0 to 2 slpm (standard liters per minute). One type of semiconductor flow sensor uses a thermal process that utilizes a heating element and two differentially arranged thermocouples to measure the temperature gradient as an indicator of the flow rate.

Flow sensor semiconductor devices can be packaged using MEMS (micro-electromechanical systems) technology. The flow sensing semiconductor device (semiconductor sensor die) can be assembled onto a substrate and packaged along with several other sensor packages in close proximity. The substrate provides electrical interconnections to the semiconductor sensor die. The assembled flow sensor packages are separated after manufacture such that they can be individually implemented into various systems or circuit boards.

In such flow sensor packages, the flow sensor semiconductor device (heating element and thermocouples) is integrated completely inside the package with an active sensing area of the semiconductor die being exposed for measuring the temperature gradient of the flowing gas or liquid. Hence the gas or liquid touches only the durable protective layer of the active sensing area, thereby protecting the semiconductor die from contamination, condensation and abrasion. Also, it is important that the flow sensor package be designed so as to ensure that mass flow along the active sensing area of the die without any turbulence. As discussed in greater detail below, according to the prior art it is known to use a spacer to align the housing of the mass flow package with the level of the die surface to prevent the mass flow from contacting the side wall of the die, thereby minimizing turbulence induced by the die thickness. However, the spacer top surface parallelism to the die surface must be carefully maintained and the bond line thickness of the spacer attachment and die attach is critical. which gives rise to issues during manufacturing and long term performance of the mass flow sensor package.

Moreover, since the die is directly attached to the top surface of the substrate, the wire bonding between substrate and die must encompass the die thickness from the die top surface to the top surface of the substrate, resulting in long wire lengths and high wire loop heights.

SUMMARY

In accordance with an aspect of the invention, a mass flow sensor module is provided wherein the semiconductor sensor die is integrated within an enhanced molded housing structure that maintains an air tight seal and protects the die from abrasive wear, and which also provides laminar flow of the liquid gas to be sensed, which can be important in sensitive applications such as IV and pump systems (kidney, heart, etc.). Since the die is embedded in the substrate; there is no need for a spacer for reducing die thickness induced flow turbulence, as in the prior art. Moreover, the die surface is at the same level as the top surface of the substrate, such that there is no performance impact due to die thickness variation and therefore no die attach bond line thickness control requirement. In one embodiment, a thermal enhancement capability is provided.

BRIEF DESCRIPTION OF THE DRAWINGS

Reference will now be made, by way of example only, to the accompanying drawings in which:

FIGS. 1A, 1B and 1C are plan and cross-sectional views of a mass flow sensor module according to the prior art, wherein FIG. 1B is a cross-section through line B-B in FIG. 1A and FIG. 1C is a cross-section through line C-C in FIG. 1A;

FIGS. 2A, 2B and 2C are plan and cross-sectional views of a mass flow sensor module according to one aspect of the invention, wherein FIG. 2B is a cross-section through line B-B in FIG. 2A and FIG. 2C is a cross-section through line C-C in FIG. 2A;

FIGS. 4A, 4B, 4C and 4D are plan, cross-section, bottom and further cross-section views of a substrate of the mass flow sensor of FIGS. 2A-2C, wherein FIG. 4B is a cross-section through line B-B in FIG. 4A and FIG. 4D is a cross-section through line D-D in FIG. 4A, according to an aspect of the invention;

FIG. 4E shows a matrix of repeating substrates, such as the substrate shown in FIGS. 4A-4D, which can be singulated into individual units after fabrication, according to an aspect of the invention;

FIGS. 5A, 5B, 5C and 5D are plan, cross-section, bottom and further cross-section views of the substrate of FIGS. 4A-4D, with passive components deposited on a second surface of the substrate, wherein FIG. 5B is a cross-section through line B-B in FIG. 5A and FIG. 5D is a cross-section through line D-D in FIG. 5A, according to an aspect of the invention;

FIGS. 6A, 6B, 6C and 6D are plan, cross-section, bottom and further cross-section views of the substrate of FIGS. 5A-5D, with a semiconductor sensing die placed in a cavity of the substrate and held in place with high temperature tape, wherein FIG. 6B is a cross-section through line B-B in FIG. 6A and FIG. 6D is a cross-section through line D-D in FIG. 6A, according to an aspect of the invention;

FIGS. 7A, 7B, 7C and 7D are plan, cross-section, bottom and further cross-section views of the substrate of FIGS. 6A-6D, with over molding encapsulant covering the passive components, filling gaps in the cavity and covering a back side of the semiconductor sensing die, wherein FIG. 7B is a cross-section through line B-B in FIG. 7A and FIG. 7D is a cross-section through line D-D in FIG. 7A, with a semiconductor sensing die placed in a cavity of the substrate and held in place with high temperature tape, according to an aspect of the invention;

FIGS. 8A, 8B, 8C and 8D are bottom, cross-section, plan and further cross-section views of the substrate of FIGS. 7A-7D, showing the high temperature tape removed and wire bonding to connect the semiconductor sensing die to the substrate, wherein FIG. 8B is a cross-section through line B-B in FIG. 8A and FIG. 8D is a cross-section through line D-D in FIG. 8A, according to an aspect of the invention;

FIGS. 9A, 9B, 9C and 9D are bottom, cross-section, plan and further cross-section views of the substrate of FIGS. 8A-8D, with encapsulant added to cover the wire bonding, wherein FIG. 9B is a cross-section through line B-B in FIG. 9A and FIG. 9D is a cross-section through line D-D in FIG. 9A, according to an aspect of the invention;

FIGS. 10A, 10B and 10C are plan and cross-sectional views of a simplified mass flow sensor module according to one aspect of the invention, wherein FIG. 10B is a cross-section through line B-B in FIG. 10A and FIG. 10C is a cross-section through line C-C in FIG. 10A;

FIGS. 11A, 11B and 11C are plan and cross-sectional views of a thermally enhanced mass flow sensor module according to one aspect of the invention, wherein FIG. 11B is a cross-section through line B-B in FIG. 11A and FIG. 11C is a cross-section through line C-C in FIG. 11A;

FIGS. 12A, 12B and 12C are plan and cross-sectional views of an enhanced mass flow sensor module with additional controller die, according to one aspect of the invention, wherein FIG. 12B is a cross-section through line B-B in FIG. 12A and FIG. 12C is a cross-section through line C-C in FIG. 12A; and FIGS. 13A, 13B and 13C are plan and cross-sectional views of an enhanced SIP (system in package) mass flow sensor module according to one aspect of the invention, wherein FIG. 11B is a cross-section through line B-B in FIG. 11A and FIG. 11C is a cross-section through line C-C in FIG. 11A.

DETAILED DESCRIPTION OF THE PRIOR ART AND EMBODIMENTS

Figure 3:
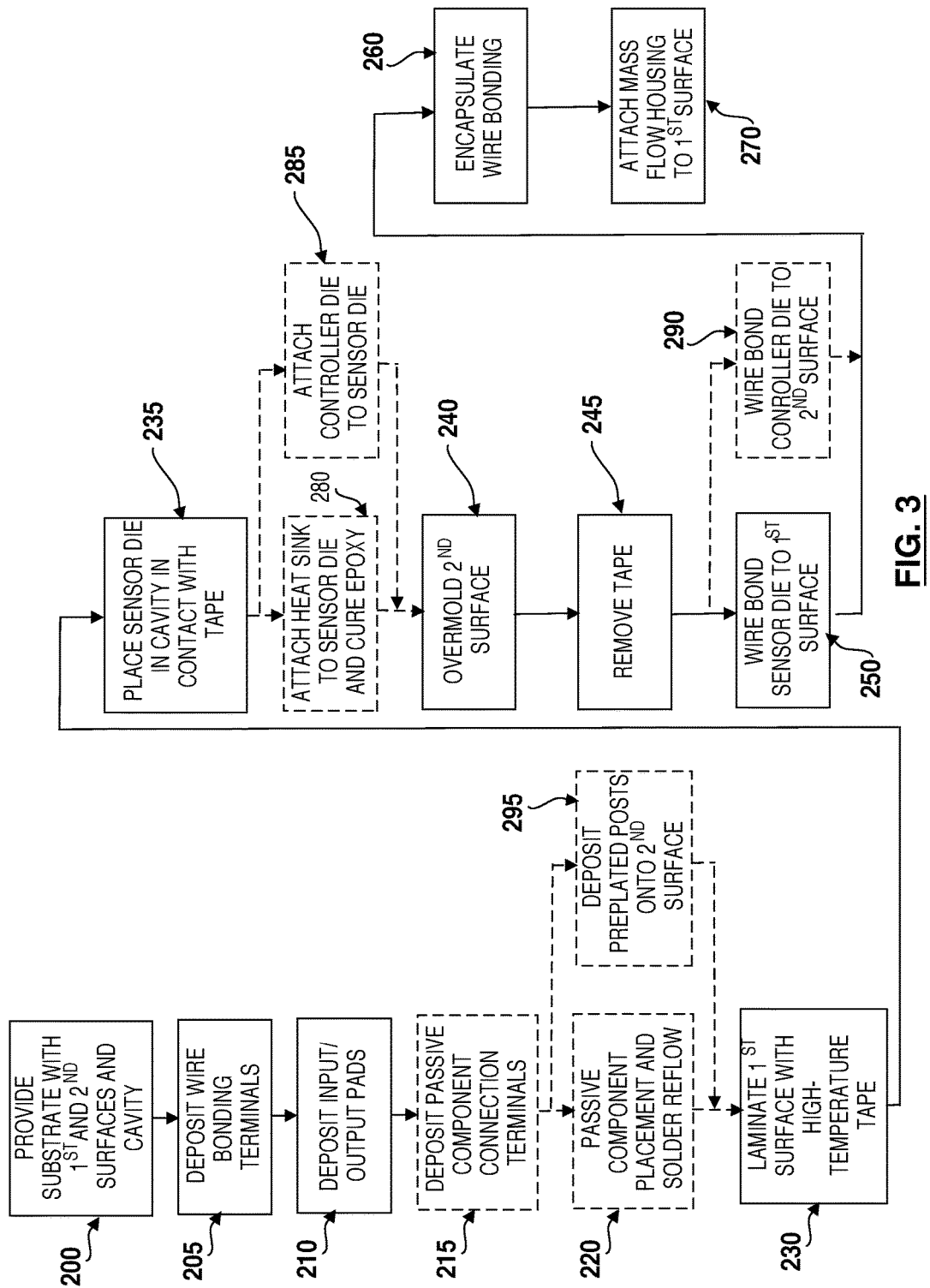
FIG. 3 is a flow chart showing steps in a process for manufacturing the mass flow sensor of FIGS. 2A-2C, according to an aspect of the invention.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

Referring to FIGS. 1A, 1B and 1C, a mass flow sensor module is generally according to the prior art. The prior art mass flow sensor module includes a substrate, such as a printed circuit board (PCB) for receiving a semiconductor sensor die that includes an active sensing area. The semiconductor die is wire bonded to the substrate and a 'glob' 102 of encapsulant covers and protects the wire bonding. A spacer attachment 103 is provided for positioning a mass flow over the semiconductor die. The housing has a mass flow tunnel 180 for directing flow of gas/liquid over the active sensing area. As discussed above, the spacer top surface parallelism to the die surface must be carefully maintained and the bond line thickness of the spacer attach and die attach is critical.

Since the semiconductor sensing die is directly attached to the top surface of the substrate, the wire bonding profile has to cover the die thickness bonding from the die top surface to the top surface of the substrate, including the die thickness. The wire length is therefore long and since the wire loop cannot be acutely bent the wire loop height is higher.

As discussed briefly above, according to the present invention the die is embedded in the substrate such that no spacer 103 is required. Moreover, in a die attach process according to an aspect of the present invention, the die surface is kept at the same level as the top surface of the substrate, so as not to be affected by die thickness variations and alleviating prior art die attach bond line thickness control requirements.

Referring to FIGS. 2A, 2B and 2C, a mass flow sensor module is generally shown at 100 that can be connected to a motherboard (not shown) via input/output pads 105, in order to provide data collected to the motherboard. It is to be understood that the sensor module 100 is purely exemplary. As discussed in greater detail below, modifications to the sensor module 100 are contemplated wherein various components can be substituted and/or added depending on the requirements of the sensor module 100. In the present embodiment, the mass flow sensor module 100 includes a substrate 110, such as a PCB. The substrate can for example be a multilayer BT laminate (e.g. FR4 and FR5), as is known in the art. The substrate has opposite first and second surfaces 115 and 120, respectively, and a cavity 300 (see FIGS. 3A, 3B and 3C) for receiving a semiconductor sensor die 130 that includes an active sensing area 135. In the illustrated embodiment, a plurality of passive devices 140, such as capacitors and resistors, are also mounted to the second surface 120.

The second surface 120 and the semiconductor sensor die 130 are encapsulated by molding 145, except for the active sensing area 135, to protect the die and passive devices 140 from abrasive wear.

The semiconductor sensor die 130 is electrically connected to the substrate 110 via wires 150 and wire bonding terminals 155 on the first surface 115. Additional encapsulation material 160 is provided to protect the wires 150 and wire bonding terminals 155.

A mass flow housing 170 is connected to the first surface 115, having a mass flow tunnel 180 for directing flow of gas/liquid over the active sensing area 135, and a pair of recess regions 190 forming an air tight seal over the wires 150 and wire bonding terminals 155.

The exemplary mass flow module of FIGS. 2A-2C can be manufactured according to the process shown in the flow-chart of FIG. 3, with reference to FIGS. 4A-4D, FIGS. 5A-5D, FIGS. 6A-6D, FIGS. 7A-7D, FIGS. 8A-8D and FIGS. 9A-9D. However, it is to be understood that the method shown in FIG. 2 is not limited to manufacture of the mass flow sensor module 100 of FIGS. 2A-2C and can be implemented to manufacture other modifications and variations of the mass flow module, such as shown in FIGS. 10A, 10B and 10C; 11A, 11B and 11C; 12A, 12B and 12C and 13A, 13B and 13C. The following discussion of the method shown in the flow-chart of FIG. 3 will lead to further understanding of the method manufacture the mass flow sensor module 100 and its various components. It is to be understood that the method can be varied, and need not work exactly as discussed herein. For example, process steps shown in FIG. 3 using dashed lines are optional.

At step 200, substrate 110 is provided having opposite first and second surfaces 115 and 120, respectively, and cavity 300, as shown in FIGS. 4A, 4B and 4C, for receiving the semiconductor sensor die 130.

Typically, rather than fabricating a single mass sensor module 100, multiple modules are mass manufactured for greater efficiency and lower cost. For example, with reference to FIG. 4E, a plurality (matrix 305) of repeating substrates 110 is shown. The matrix 305 can be fabricated with score lines 307 to separate the sensor modules from adjacent sensor modules. It is to be appreciated by a person of skill in the art with the benefit of this description that the sensor modules can be singulated after fabrication by application of force to various portions of the substrates to stress the structurally weaker score lines 307, or by using saw or laser singulation. Once separated, the sensor modules 100 can be attached to a motherboard (not shown).

At step 205, wire bonding terminals 155 are deposited (e.g. by either a subtractive or additive process, as is known in the art of PCB manufacturing) on the first surface 115 for later wire bonding to the semiconductor die 130. Similarly, at step 210 input/output pads 105 are deposited on the first surface 115

In the embodiment of FIGS. 2A-2C, passive component connection terminals 330 are deposited on the second surface 120 at step 215, followed at step 220 by depositing passive components 140, such as capacitors and resistors, as shown in FIGS. 5A-5D. The deposition of passive components 140 at step 220 may include steps of solder printing, placement of the components and solder reflow.

At step 230, a high temperature tape 500 having adhesive on one side, is laminated to the first surface 115 of substrate 110, as shown in FIGS. 6A-6D. Then, at step 235 semiconductor die 130 is placed within cavity 300 such that active sensing area 135 is in contact with the adhesive side of tape 500.

At step 240, the second surface 120 is molded over (e.g. with epoxy molding compound or "glob" top material, via a transfer molding process, compression molding or dispensing) with encapsulation material 145 to cover the passive components 140, fill all gaps 135 in cavity 300 and cover the back (non-sensing) side of die 130, as shown in FIGS. 7A-7D.

At step 245, high temperature tape 500 is removed (e.g. peeled off), exposing active sensing area 135 and wire bonding terminals 155, followed by wire bonding at step 250 to connect the die 130 to the wire bonding terminals 155 via conductive wires 150, as shown in FIGS. 8A-8D.

At step 260, a 'glob' of additional encapsulation material 160 is deposited to cover the wires 150 and wire bonding terminals 155, leaving the active sensing area 135 exposed, as shown in FIGS. 9A-9D.

At step 270, mass flow housing 160 is attached to the first surface 115, as shown in FIGS. 2A-2C. The housing 160 is designed to have sufficient contact area for attachment to the substrate while providing a mass flow tunnel 180 for laminar flow of the mass medium over the active sensing area 135.

As discussed above, numerous modifications and variations are possible. For example, as indicated by the dashed lines in FIG. 3, inclusion of passive components 140 is optional, in which case process steps 215 and 220 may be omitted, resulting in a simplified mass flow module, such as illustrated in FIGS. 10A-10C.

A thermally enhanced modification incorporates a heat sink 1000, as shown in FIGS. 11A-11C, which is attached to the surface of die 130 opposite to the active sensing area 135 by applying thermally conducting epoxy 1010 to the side of the semiconductor sensor die opposite the active sensing area 135, placing the heat sink on the thermally conducting epoxy and then curing the epoxy, as shown by dashed line step 280 in FIG. 3.

A dual-die modification incorporates a controller die 1100, in addition to the sensing die 130, 1000, as shown in FIGS. 12A-12C, which is attached to the surface of die 130 opposite to the active sensing area 135 by thermally conducting epoxy which is then cured, as shown by dashed line step 285 in FIG. 3, followed by wire bonding 1110, as shown by dashed line step 290 in FIG. 3.

In a further modification, preplated posts 1200 are attached to the second surface 120 at the same time as the passive components are placed, as shown by dashed line step 295 in FIG. 2, resulting in the configuration of FIGS. 13A-13C, for surface mounting to a printed circuit board (not shown). The posts 1200 may fabricated from copper that is preplated with NiAdAu.

While specific embodiments have been described and illustrated, such embodiments should be considered illustrative only and should not serve to limit the accompanying claims.

What is claimed is:

1. A method of manufacturing a mass flow sensor module, the method comprising:
    proving a substrate having opposite first and second surfaces and a cavity;
    depositing wire bonding terminals on at least one of the first and second surfaces for electrically connecting the semiconductor die to the substrate via wires;
    depositing input/output pads on one of the first and second surfaces;
    connecting the input/output pads to the wire bonding terminals for external connection to the module;
    laminating the first surface with a high temperature tape having adhesive on one side;
    placing a semiconductor sensor die having an active sensing area on one side within the cavity such that active sensing area is in contact with the adhesive;
    molding over the second surface with encapsulation material to fill gaps in the cavity and cover the side of the semiconductor sensor die opposite the active sensing area;
    removing the high temperature tape to expose the active sensing area and wire bonding terminals;
    wire bonding the semiconductor sensor die to the first surface via the wire bonding terminals;
    depositing additional encapsulation material to cover the wire bonding while leaving the active sensing area;
    attaching a mass flow housing to the first surface for providing laminar flow over the active sensing area.

2. The method of claim 1, wherein a heat sink is attached to the side of the semiconductor sensor die opposite the active sensing area before molding over the second surface with encapsulation material.

3. The method of claim 2, wherein the heat sink is attached by applying thermally conducting epoxy on the side of the semiconductor sensor die opposite the active sensing area, placing the heat sink on the thermally conducting epoxy and then curing the epoxy.

4. The method of claim 1, wherein the controller die is attached by applying thermally conducting epoxy on the side of the semiconductor sensor die opposite the active sensing area, placing the controller die on the thermally conducting epoxy and then curing the epoxy.

5. The method of claim 4, further comprising wire bonding the controller die to the connection terminals.

6. The method of claim 5, wherein preplated posts are attached to the second surface at the same time as placing the passive components on the connection terminals.

* * * * *